United States Patent [19]

Venkateswaran

[11] Patent Number: 4,538,247
[45] Date of Patent: Aug. 27, 1985

[54] REDUNDANT ROWS IN INTEGRATED CIRCUIT MEMORIES

[75] Inventor: Kalyanasundaram Venkateswaran, San Jose, Calif.

[73] Assignee: Fairchild Research Center, Mountain View, Calif.

[21] Appl. No.: 457,999

[22] Filed: Jan. 14, 1983

[51] Int. Cl.³ ............................................. G11C 11/40
[52] U.S. Cl. .................................... 365/230; 365/200; 365/210
[58] Field of Search ................. 365/189, 200, 210, 230

[56] References Cited

U.S. PATENT DOCUMENTS 4,250,570  2/1981  Tsang et al. ......................... 365/210

Primary Examiner—Terrell W. Fears
Attorney, Agent, or Firm—Carl L. Silverman; David H. Carroll; Robert C. Colwell

[57] ABSTRACT

Decoding apparatus for an integrated circuit memory having normal rows of memory cells 10 and at least one selectively connectable redundant second row of memory cells 31 for being connected in place of one of the first rows 10 includes a redundant decoder (transistors 32, 33 ... n) connected to each of the redundant rows 31, the redundant decoder including a plurality of selectable connections ($F_1, F_2 ... F_n$) for creating an address for each of the at least one redundant rows 31; a control signal generating circuit (gates 45, 46, and 47) for generating a control signal of a first state until an address is supplied to the memory and of a second state if any of the redundant rows 31 are selected by the address, and another decoder (transistors 23 and 39) connected to receive control signal $\phi_C$ from the generating circuit for controlling normal rows 10 and the redundant row 31 in response thereto.

18 Claims, 3 Drawing Figures

REDUNDANT ROWS IN INTEGRATED CIRCUIT MEMORIES

BACKGROUND OF THE INVENTION

1. Field of the invention

This invention relates to integrated circuit memories, and in particular, to an apparatus for providing redundant rows in such memories when other portions of the memory are found defective.

2. Description of the Prior Art

In integrated circuit memories, a single defect in any portion of the array of memory cells may render the entire memory useless. As improvements in the design and fabrication of integrated circuits are made, greater numbers of memory cells are being placed on a single chip. Furthermore, generally physically larger integrated circuits are being manufactured. Each factor tends to increase the likelihood of a defect in one or more cells which may render an entire chip useless.

One prior art solution to this problem has been to design and fabricate integrated circuit memories using more fault tolerant designs and processes. This approach, by itself, does not always suffice. Consequently, another solution which has received increasing attention is the fabrication of redundant components on the same chip. At a suitable stage in the fabrication process, the non-functional portions of the circuit are replaced with the redundant portions, typically by using redundant wiring techniques, fuses, discretionary metal masks, or other techniques. The usual prior art approach, however, has been to replace an entire relatively large block in the memory with a new block. For example, in a 64 k memory divided into 16 sections, each of 4 k bits, a defective bit in a single section will result in the replacement of the entire 4 k section. Unfortunately, this approach requires a considerable amount of extra logic and extra space on the integrated circuit.

While redundant rows improve yield, and are relatively simple to implement, the addressing scheme for redundant rows is critical because it lies along the critical signal path. The added decoding circuits for the redundant rows, when selected by laser fusing or other techniques, must select the redundant row and at the same time de-select all the other redundant rows and normal rows of memory cells. At the same time, the operating speed of the overall memory must not be affected by the added circuitry.

SUMMARY OF THE INVENTION

According to this invention when a memory having redundant rows turns on from inactive to active, a control signal remains low to pull all rows, including the redundant rows, high until the address inputs become valid. Once the address inputs become valid, if a redundant row has been selected the control signal switches to an opposite state to deselect all of the normal rows. This makes the memory transparent to delay in the address buffers.

In the preferred embodiment decoding apparatus for an integrated circuit memory having first rows of memory cells and at least one selectively connectable redundant second row of memory cells for being connected in place of one of the first rows comprises a redundant decoder connected to each of the at least one second row, the redundant decoder including a plurality of selectable connections for creating an address for each of the at least one second row; logic means for generating a control signal of a first state until an address is supplied to the memory and of a second state if any of the at least one second row is selected by the address; and decoder means connected to receive the control signal from the logic means for controlling the first rows and at least one second row in response thereto. In the preferred embodiment the logic gate means includes an OR gate to which all redundant row addresses are supplied and an exclusive OR gate to which a desired address and its complement are supplied. The output from the OR gate and the exclusive OR gate are supplied as inputs to a NAND gate, which provides the control signal as its output.

DETAILED DESCRIPTION OF THE PREFERRED EMBODIMENTS

Figure 1:
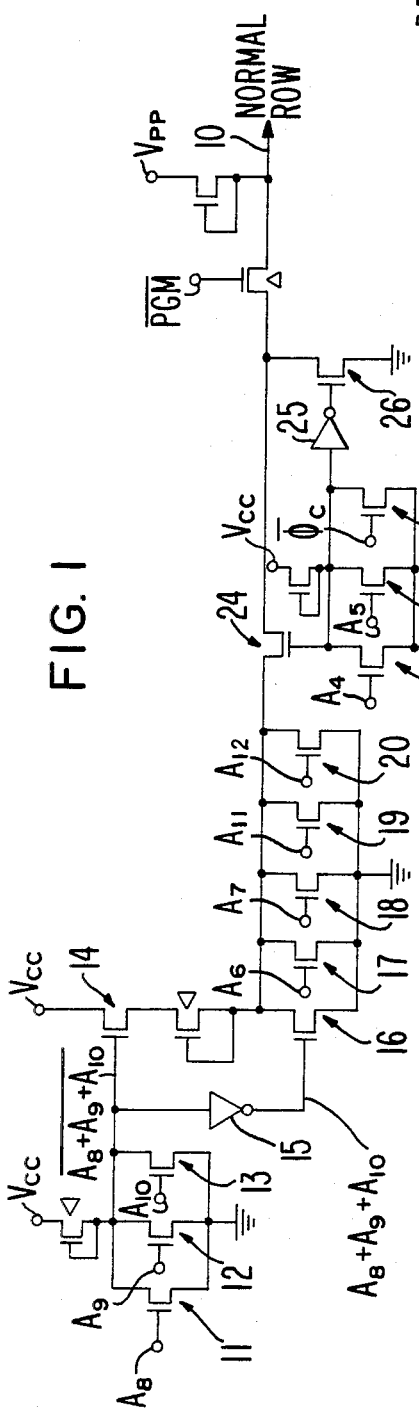
FIG. 1 is an electrical schematic illustrating an addressing circuit for a normal row of an integrated circuit memory.

FIG. 1 is a circuit schematic illustrating typical decoding apparatus for a normal row of memory cells connected to line 10. The apparatus includes transistors 11, 12, and 13 to which address signals $A_8$, $A_9$, and $A_{10}$ are supplied. The combined signals of these three transistors are applied to the gate of transistor 14 to selectively connect line 10 to potential $V_{CC}$, assuming certain other transistors are on. The address signals from transistors 11, 12, and 13 are also supplied, after being inverted by inverter 15, to the gate of transistor 16. As also shown address signal $A_6$ controls transistor 17, address signal $A_7$ controls transistor 18, address $A_{11}$ controls transistor 19, and address signal $A_{12}$ controls transistor 20. In a similar fashion address $A_4$ controls transistor 21, address $A_5$ transistor 22, and a control signal $\phi_C$ transistor 23. The combined address signals of transistors 21, 22, and 23 control transistor 24 as shown. The same combined address signals inverted by inverter 25 also control transistor 26.

In operation if the row connected to line 10 is to be addressed, address signal $A_8+A_9+A_{10}$ will be low turning on transistor 14 and pulling row line 10 to potential $V_{CC}$ during reading of the memory cells attached to line 10. Alternatively, line 10 may be pulled to potential $V_{PP}$ during programming by application of a signal to the node designated $\overline{PGM}$. In addition, to address row 10 transistors 17, 18, 19, and 20 must be off. If any of these transistors are on then line 10 will be pulled to ground. The signal supplied to transistor 16 is complementary to that supplied to transistor 14.

The potential of line 10 is also controlled by a smaller decoder connected to receive addresses $A_4$ and $A_5$, and control signal $\phi_C$. These signals are supplied to transistors 21, 22, and 23 respectively, and thereby control transistors 24 and 26. Of course, if transistor 26 is on, then line 10 will be pulled to ground, because transistor 24 will be off. The control signal $\phi_C$ supplied to transistor 23 is generated using the apparatus shown in FIG. 3, and will be discussed in conjunction with that Figure.

Figure 2:
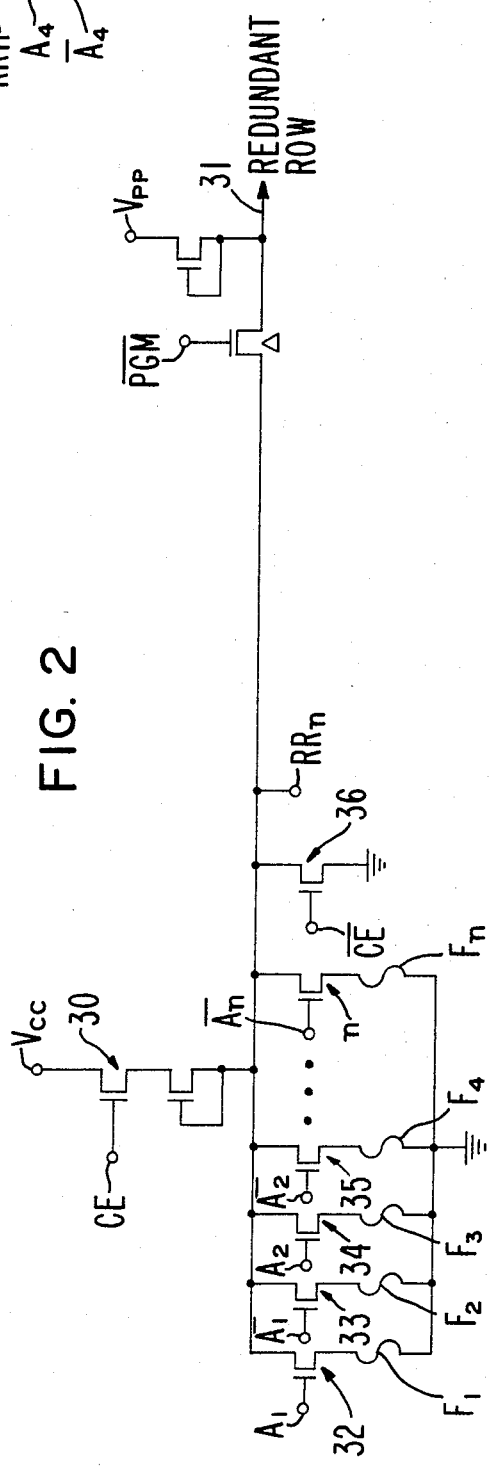
FIG. 2 is a circuit schematic of a decoder for a redundant row of a memory.

FIG. 2 illustrates the decoding apparatus associated with the redundant row. A chip enable signal CE is supplied to transistor 30 to connect the redundant row associated with line 31 to potential $V_{CC}$ unless one of the decoding transistors 32, 33, ... n is turned on to pull line 31 to ground. Each of these decoding transistors is serially connected with a fuse $F_1, F_1, \ldots F_n$, which, in the preferred embodiment, may be "blown" using a laser. Fuses such as these are well-known in the semiconductor arts. If any of these fuses are blown, then the address signals supplied to the gate of the corresponding transistor will have no effect upon the addressing of row 31. If none of the fuses are blown, then when any address is supplied, the redundant row coupled to line 31 will be pulled to ground, and the presence of the redundant row will not affect the remainder of the memory.

If the redundant row is desired, then all fuses are blown except for those corresponding to the desired address of the redundant row. In this manner the redundant row will be pulled to ground only when one or more of its address bits having intact fuses are high. If all the connected address bits are low, then redundant row 31 will be selected.

Figure 3:
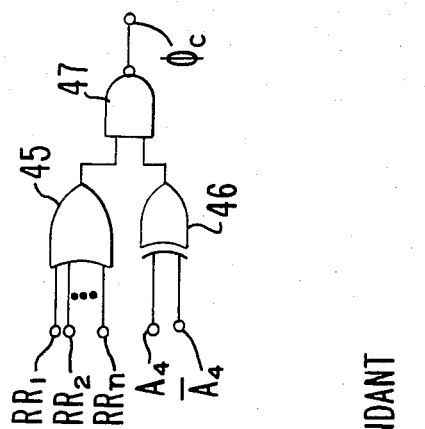
FIG. 3 is a schematic of the circuit used to generate the control signal supplied to FIGS. 1 and 2.

FIG. 3 illustrates the manner in which the control $\phi_C$ is generated for application to transistors 23 and 39. As shown in FIG. 3, a plurality of redundant row addresses $RR_1, RR_2 \ldots RR_n$, (whose origins are as shown in FIG. 2) are applied to an OR gate 35. Address inputs $A_4$ and $\overline{A_4}$ are applied to the terminals of exclusive OR gate 46. The output signals from gates 45 and 46 are supplied to input terminals of NAND gate 47 to thereby generate a control signal $\phi_C$, which after being inverted, is used to control transistor 23.

For the circuit shown in FIGS. 1, 2, and 3 when the chip containing the memory cells is enabled, signal $\phi_C$ stays low. All rows, including any redundant rows are pulled high because, all addresses are low unconditionally when the chip is deselected, until the outputs of the address buffers are valid. Once address signals $A_4$ and $\overline{A_4}$ are valid, exclusive OR gate 46 supplies a signal to NAND gate 47. If a redundant row has been selected, OR gate 45 will also supply a signal and $\phi_C$ will go low and $\overline{\phi_C}$ high to deselect all normal rows. Thus for every redundant row only the selected fuses need be blown to provide the necessary address signals. If no fuses are blown, then the redundant row will not be selected by any address.

Although one embodiment of this invention has been described above, this embodiment is intended to illustrate the invention, rather than limit it. The scope of the invention may be determined from the following claims.

I claim:

1. Decoding apparatus for an integrated circuit memory having first rows of memory cells, each first row being selectable by a row address, including at least one address bit, and having at least one second row selectively connectable in place of one of the first rows, the apparatus comprising:
   at least one redundant decoder means, each redundant decoder means being connected to a second row, including a plurality of selectable connections for creating an address for the connected second row, and including means for producing an address signal of a first level if the row address corresponds to the created address and of a second level if the row address does not correspond to the created address;
   logic means for generating a control signal of a first state until an address bit is supplied to the memory and of a second state if at least one address signal from the at least one second row is of the first level; and
   decoder means connected to each first row to receive the control signal from the logic means for controlling the first rows in response thereto.

2. The apparatus of claim 1 wherein the logic means comprises:
   first means connected to receive the address signal from each of the at least one second row; and
   second means connected to receive a selected address bit.

3. The apparatus of claim 2 wherein the first means supplies a first output signal if any of the address signals for the at least one second row is of the first level.

4. The apparatus of claim 3 wherein the first means comprises an OR gate.

5. The apparatus of claim 3 wherein the second means is connected to receive a complement of the address bit and supply a second output signal.

6. The apparatus of claim 5 wherein the second means comprises an exclusive OR gate.

7. The apparatus of claim 6 wherein both of the first and second output signals are connected as inputs to a logic gate.

8. The apparatus of claim 7 wherein the logic gate comprises a NAND gate.

9. The apparatus of claim 7 wherein the logic gate output is the control signal.

10. The apparatus of claim 1 wherein each redundant decoder comprises a plurality of transistors each adapted to receive an address bit.

11. The apparatus of claim 10 wherein each transistor is connected to the second row and a fusing means is serially connected between each transistor and ground.

12. The apparatus of claim 11 wherein each fusing means comprises a laser destructible electrical connection.

13. The apparatus of claim 11 wherein each transistor includes a control electrode connected to receive an address bit.

14. The apparatus of claim 1 having at least two second rows.

15. The apparatus of claim 3 having at least two second rows.

16. The apparatus of claim 6 having at least two second rows.

17. The apparatus of claim 9 having at least two second rows.

18. The apparatus of claim 13 having at least two second rows.

* * * * *